United States Patent [19]

Blackstone

[11] Patent Number: 5,004,705
[45] Date of Patent: Apr. 2, 1991

[54] INVERTED EPITAXIAL PROCESS

[75] Inventor: Scott C. Blackstone, Needham, Mass.

[73] Assignee: Unitrode Corporation, Lexington, Mass.

[21] Appl. No.: 295,045

[22] Filed: Jan. 6, 1989

[51] Int. Cl.$^5$ .................. H01L 21/20; H01L 21/76
[52] U.S. Cl. ................................. 437/225; 437/31; 437/74; 437/946; 437/974; 148/DIG. 11; 148/DIG. 12
[58] Field of Search ............. 437/225, 247, 946, 974, 437/31, 74; 148/DIG. 12, DIG. 159

[56] References Cited

U.S. PATENT DOCUMENTS

| | | | |
|---|---|---|---|
| 3,375,418 | 3/1968 | Garnache et al. | 317/235 |
| 4,402,128 | 9/1983 | Blackstone | 29/591 |
| 4,526,665 | 7/1985 | Taniellian et al. | 204/192 C |
| 4,546,375 | 10/1985 | Blackstone et al. | 357/23.4 |
| 4,549,926 | 10/1985 | Corboy, Jr. et al. | 156/612 |
| 4,578,142 | 3/1986 | Corboy, Jr. et al. | 156/612 |
| 4,582,559 | 4/1986 | Tanielian et al. | 156/603 |
| 4,586,240 | 5/1986 | Blackstone et al. | 29/571 |
| 4,638,552 | 1/1987 | Shimbo et al. | 29/576 J |
| 4,649,627 | 3/1987 | Abernathey et al. | 437/974 |
| 4,671,846 | 6/1987 | Shimbo et al. | 156/629 |
| 4,700,466 | 10/1987 | Nakagawa et al. | 437/247 |
| 4,707,197 | 11/1987 | Hensel et al. | 437/189 |
| 4,717,681 | 1/1988 | Curran | 437/31 |
| 4,728,626 | 3/1988 | Tu | 437/126 |
| 4,738,935 | 4/1988 | Shimbo et al. | 437/31 |
| 4,758,534 | 7/1988 | Derkits, Jr. et al. | 437/89 |
| 4,784,970 | 11/1988 | Solomon | 437/974 |
| 4,791,465 | 12/1988 | Sakai et al. | 357/25 |

OTHER PUBLICATIONS

Baliga, Jayant B., Fellow, IEEE: Analysis of a High--Voltage Merged p-i-n/Schottky (MPS) Rectifier; Corporate Research and Development, General Electric Company, Schenectady, N.Y. 12301, IEEE Log Number-8715453.
Hashimoto, Norikazu; Koga, Yashushi: The Si-WSi$_2$-Si Epitaxial Structure; Journal Electrochemical Society, vol. 114, No. 11, Nov., 1967, pp. 1189-1191.
Ishiwara et al.; Laser and Electron-Beam Solid Interactions & Materials Processing (Gibbons, J. F. edited); Materials Research Society Symposia Proceedings, 1981, pp. 525-531.
Saitoh et al.; Double Heteroepitaxy in the Si (111) CoSi$_2$Si Structure; Appl. Phys. Lett., 37(2), Jul. 15, 1980, pp. 203-205.

Primary Examiner—Brian E. Hearn
Assistant Examiner—Tuan Nguyen
Attorney, Agent, or Firm—Weingarten, Schurgin, Gagnebin & Hayes

[57] ABSTRACT

A process for fabricating a semiconductor device by forming a diffusion region in a first semiconductor wafer and bonding the surface of the first semiconductor wafer having the diffused region to a second semiconductor wafer to form a low resistance buried layer. The process includes further diffusion to provide an external electrical contact with the buried layer. Further enhancements are provided by selectively forming voids and/or selectively applying materials of greater and lesser conductivity on at least one of the semiconductor wafers before bonding, forming complex internal semiconductor structures in the bonded wafer structures.

69 Claims, 11 Drawing Sheets

INVERTED EPITAXIAL PROCESS

FIELD OF THE INVENTION

The present invention relates to methods of semiconductor manufacture, and more specifically, to a method of fabricating an epitaxial semiconductor device including the step of bonding two more more semiconductor wafers together

BACKGROUND OF THE INVENTION

The Conventional Planar Process

The conventional junction isolated planar process provides the vertical semiconductor device 50 of FIG. 1, wherein the buried layer 52 is formed before the epitaxial layer 54 is grown. The device 50 has a breakdown voltage of about 150-200 volts and about 3-5 amperes maximum capacity, respectively. This process forces the buried layer 52 to be moderately doped so as not to lower the quality of the subsequent epitaxial film. The moderate doping of the buried layer creates a parasitic resistance, which limits the current conduction in the device due to ohmic heating, and causes unacceptably high voltage drops across the device Further processing of the wafer at high temperatures causes the buried layer 52 to updiffuse and thus limit the remaining amount of uncompensated epitaxial film. The updiffusion of the buried layer 52 reduces the breakdown voltage of the vertical device and is self-limiting. As a result, devices which are to have breakdown voltages above 150-200 volts require additional nonstandard processing such as multiple epitaxial layers.

The typical junction isolated planar process starts typically with a lightly doped P wafer 60 in which a deep, moderately doped N layer 62 is selectively formed as shown in FIG. 2. The N layer 62 is called the buried layer and is used to direct the bottom junction current laterally to a vertical diffusion contact to the surface, and thus effectively providing a resistance in series with the active device element. This series resistance is effectively in series with the collector (56 of FIG. 1) or drain of a transistor and thus this limits the current capability while achieving a Vce(Sat) or a Rds(ON) or power dissipation specification. To minimize this series resistance, the buried layer should be as heavily doped as possible. The upper limit of doping is set by the epitaxial process which degrades if the doping becomes too high. The buried layer doping is usually done with arsenic which is used to limit later outdiffusion, but arsenic is difficult to diffuse and results in damage to the substrate wafer if not carefully handled. Moreover, the resistivity of the buried layer is typically limited to 20-50 ohms/square.

The next step in the typical prior art process is the epitaxial growth step providing the structure shown in FIG. 3. The buried layer 62A moves up into the epitaxial layer requiring that the epitaxial layer 64 be grown thick enough such that the thickness 66 of the layer 64 film above the buried layer 62A meets the thickness specification of the semiconductor device. The thickness 66 of the layer 64 film is the parameter that sets the breakdown voltage of the vertical device; the larger the distance 66, the higher the potential breakdown voltage.

The next step in the typical prior art process after the growth of the epitaxial layer 64 is the diffusion of an oppositely doped material to form junction isolated (JI) pockets in the epitaxial layer that will be used to form the device structural elements. Also, a heavily doped ohmic diffusion is done at this time The step of diffusion into the JI pockets comprises the diffusion of a P type material as shown in FIG. 4. The P region 55 must be driven completely through the epitaxial layer 54 into the substrate 51 to achieve complete junction isolation. As this process is gradient driven, it takes increasingly longer times to diffuse a fixed distance down as the diffusion becomes deeper and deeper, resulting in a practical JI diffusion depth of about 20-30 microns. Attempts to increase this depth by etching grooves or recesses into the silicon before diffusion would result in loss of the planarity, except in the case of very narrow trenches which can be backfilled and planarized with a thin film by additional process steps.

Effectively deeper diffusions can be achieved by doing a JI diffusion from both the top and bottom by using a P+ as well as an N buried layer. However, as the isolation diffusion moves down and the buried layer moves up, the usable epitaxial thickness 68 is reduced. Moreover, deep isolation diffusions thus do not necessarily result in a thick uncompensated epitaxial layer. The higher the doping of the buried layer, the faster that it moves up. Thus the competing demands of low resistivity buried layers 52 and high breakdown voltage force a compromise that limits both. Any additional uncompensated epitaxial thickness gained by driving the isolation diffusion region deeper is offset by the buried layer 52 moving up that much further. Typically, driving the isolated diffusion region deeper can result in a 15 micron thick as-grown epitaxial film reducing to only 3 microns of usable epitaxial material left between the top of the buried layer and the bottom of the top diffusion. Translated into operating voltage potential, this means an epitaxial layer 54 with potential ability to operate at 300 volts (using 20 volts/micron) ends up with an operating voltage of only 60 volts. The above-discussed competing diffusions self-limit the effectiveness of the process, resulting in a practical upper limit of this technology, generally agreed to be about 200 volts. Thus, in applications typically including an integrated circuit (IC) which require a high voltage, high current device, a supplemental discrete device must be added to the linear IC thus requiring two or more separate chips.

Direct Wafer Bonding

Two silicon wafers may be bonded together to produce a particular device or structure as discussed in the background of the related application Ser. No 202,112, entitled "Wafer Bonding Using Low Temperature Neutral Alloys" (UNI-046XX), filed June 3, 1988, and incorporated by reference. Other wafer bonding techniques also incorporate one or more metal layers between the two wafers to act as the bonding agent. For instance, the heating of an aluminum layer between the wafers in a furnace causes the aluminum to diffuse into the two wafers and bond them together resulting in P type diffusion in the silicon that was in contact with the aluminum. If a thin layer of aluminum is used, it will be entirely consumed during the bonding leaving the wafers in direct contact. Silver is also widely used as a bonding agent. In this case, the silver forms a eutectic bond with the silicon, but does not diffuse into it. When the wafers are cooled, they are bonded with a layer of silver between them. These wafers can be further processed at temperatures of over 1000° C. without problems of separation or delamination. The silver can also be used in conjunction with aluminum.

A second technique of bonding wafers is to use a sodium glass layer and high voltage to electrostatically bond the wafers together. In this case, the two wafers are separated electrically by a glass insulator, as may be used in a dielectrically isolated structure. A third technique is to place two or more wafers together in a clamp and heat them under high clamping pressure to achieve a bond directly between the silicon wafers.

All of these techniques have drawbacks which are severe enough to limit them to very specialized applications of limited volume. The metallic bonding has the drawback of the heavy P doping from the aluminum layer and the low temperature of the silver bonding. In addition, the bonding processes are difficult in that they require nonstandard equipment and proprietary techniques. The electrostatic process involves the use of sodium containing glass which is incompatible with conventional IC processing and devices In addition, the flatness of the glass has historically been a problem in achieving good bonding across the entire wafer. The work on clamped wafers has also resulted in high levels of contamination as well as inducing damage into the wafers being bonded.

Notwithstanding these techniques, which have been available for several years, the focus of research has continued to be directed to new and better techniques for bonding wafers which are free of contamination, doping and crystal damage.

A representative example of state of the art research in this technology is provided by the following references which address the issues of direct wafer bonding: "Improved Dielectrically Isolated Device Integration by Silicon-wafer Direct Bonding (SDB) Technique," Hiromichi Ohashi, Junichi Ohura, Tsuneo Tsukakoshi and Masaru Simbo, 1986 IEEE, IEDM 86, pp. 210-213; "1800V Bipolar-Mode MOSFETs: a first application of Silicon Wafer Direct Bonding (SDB) technique to a power device," Akio Nakagawa, Kiminori Wantanabe, Yoshihiro Yamaguchi, Hiromichi Ohashi and Kazuyoshi Furukawa, 1986 IEEE, IEDM 86, pp. 122-125; "Study of Si-Wafer Directly Bonded Interface Effect on Power Device Characteristics," H. Ohashi, K Furukawa, M. Atsuta, A. Nakagawa and K. Imamura, 1987 IEEE, IEDM 87, pp 678-681. The basic concept presented in the above-cited papers is that if two wafers are processed to have their polished surfaces properly conditioned, the two polished sides can be placed in contact in a way that surface tension will hold them together and the combined wafers can be heated in a furnace at, for instance, 1100° C. where they will bond together to form a single thick wafer. This technique works both for silicon to silicon as well as an oxidized silicon wafer to a silicon wafer or an oxidized silicon wafer to an oxidized silicon wafer. Because the technique requires no intermediate layer and no pressure to bond, the resulting bond is clean with little or no damage to the bonded wafers.

The fabrication of dielectrically isolated (DI) substrates which are useful in many electronic applications is discussed in "Improved Dielectrically Isolated Device Integration by Silicon-wafer Direct Bonding (SDB) Technique," Hiromichi Ohashi, Junichi Ohura, Tsuneo Tsukakoshi and Masaru Simbo, 1986 IEEE, IEDM 86, pp 210-213, providing the structure of FIG. 5. An oxidized silicon wafer is bonded to a silicon substrate 72 which provides a mechanical substrate and which has an excellent match of coefficient of thermal expansion and is a good thermal conductor. The oxidized wafer is then thinned to the desired thickness by conventional lapping and polishing techniques to produce a thin single crystal layer on a thermal silicon dioxide layer. The thin single crystal region is then patterned into islands using a chemical etching technique. The islands are then oxidized and covered with a layer of polycrystalline silicon thicker than the single crystal film. The wafer was then lapped and polished again to produce thinner single crystal island surrounded by regions 76 of polycrystalline silicon. These islands are electrically isolated from each other and the resulting devices 74 made in them are also isolated from each other and have little or no parasitic interaction.

A second application is discussed in "1800V Bipolar-Mode MOSFETs a first application of Silicon Wafer Direct Bonding (SDB) technique to a power device," Akio Nakagawa, Kiminori Wantanabe, Yoshihiro Yamaguchi, Hiromichi Ohashi and Kazuyoshi Furukawa, 1986 IEEE, IEDM 86, pp. 122-125, shown in FIG. 6 which is to use direct wafer bonding to replace epitaxial technology. An N− wafer 82 has a deep N+ and a shallow P+ layer diffused into the polished surface and then is bonded to a P+ wafer 84 The N− wafer is then thinned to the desired thickness by conventional lapping and polishing techniques. The bonding of the wafers then replaces the growing of an epitaxial layer as thick as the thinned N− wafer, where the thickness of the final N− layers is in the order of 100 microns. The 100 micron thickness is at the upper limit of epitaxial technology and usually results in a significant population of spikes in the surface of the epitaxial film along with a thicker rim commonly known as crowning.

A third application discussed in "Study of Si-Wafer Directly Bonded Interface Effect on Power Device Characteristics," H. Ohashi, K Furukawa M. Atsuta A. Nakagawa and K. Imamura, 1987 IEEE, IEDM 87, pp. 678-681 relates to the electrical function of a bonded joint in a device fabricated on a direct wafer bonded wafer If the bonded joint is near but not in a region of stored minority carriers it will recombine them in a manner similar to introducing a lifetime killing technique such as a gold diffusion, electron beam irradiation, etc. FIGS. 7A and 7B provide exemplary waveforms of an IGBT (Insulated Gate Bipolar Transistor) turn-off time as a function of the distance between the region of stored minority carriers and the bonded joint. According to the reference and as illustrated in FIGS. 7A and 7B, moving the bonded joint from four microns away to only 3.5 microns away significantly reduces the turn-off time and thus made the device faster without the use of other lifetime reducing techniques.

SUMMARY OF THE INVENTION

The present invention comprises a process of fabricating a new class of semiconductor devices including the steps of bonding two semiconductor wafers together, including in the region of the bonded surfaces further conductive diffusions or material areas applied before bonding of the wafers, which conductive areas form buried layers and are made electrically accessible by sinker diffusions made through one of the semiconductor wafers. The diffused or conductive areas provided at the region of the wafer bond are more precisely controlled and higher in conductivity, providing a resulting structure which exhibits higher performance over conventional semiconductors incorporating a buried, highly resistive region diffused deeply into a single semiconductor.

Further enhancements to the process are presented to permit the fabrication of complex semiconductor structures, connected horizontally and vertically, and including further process steps permitting the bonding of additional wafers. Moreover, the process according to the present invention permits the construction of single integrated circuit devices having both high power semiconductor elements and dense, low-power devices incorporated in related circuitry. The process of the present invention is of particular interest in the area of high voltage and/or high current discrete devices or integrated circuits.

The process allows the fabrication of the buried layer in a planar process after the epi layer is grown, which permits construction of vertical devices having breakdown voltages of hundreds of volts and forward currents of tens of amps, providing a significant improvement over the present planar process practiced in the industry Furthermore, the process according to the present invention may be integrated into conventional semiconductor fabrication processes, providing a superior performing device without imposing additional technical, economic, or manufacturing restrictions in the manufacture of such devices.

BRIEF DESCRIPTION OF THE DRAWING

These and other features of the present invention will be better understood by reading the following detailed description, taken together with the drawing, wherein.

DETAILED DESCRIPTION OF THE INVENTION

The process according to the present invention separates the isolation diffusion regions from the buried layer diffusion regions without limit to the doping of the buried layer.

Figure 1:
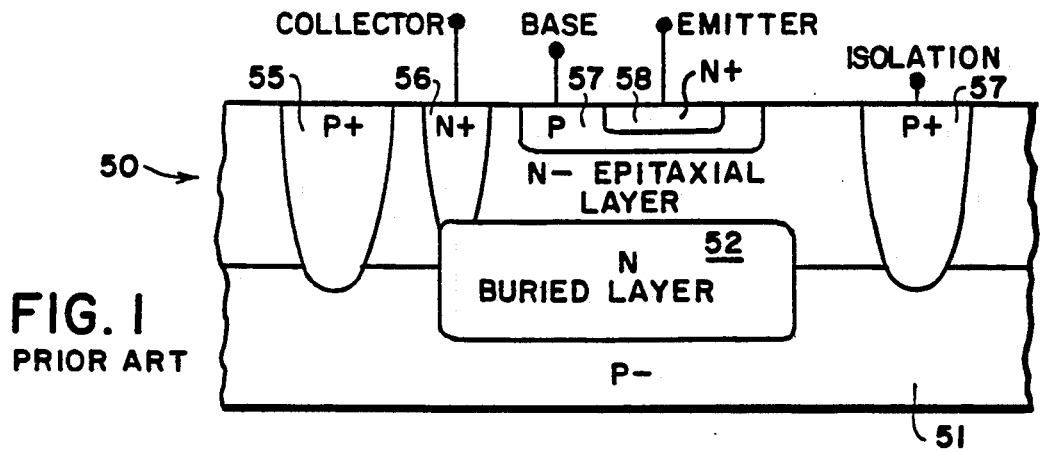
FIG. 1 is a vertical cross section of a semiconductor device made according to a conventional, prior art planar process.
Figure 2:
FIG. 2 is a vertical cross section of a wafer of the device shown in FIG. 1 at an earlier stage of fabrication.
Figure 3:
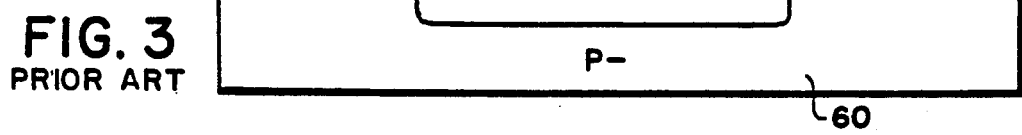
FIG. 3 is a vertical cross section of a wafer of the device of a semiconductor in FIG. 1 at a step subsequent to FIG. 2.
Figure 4:
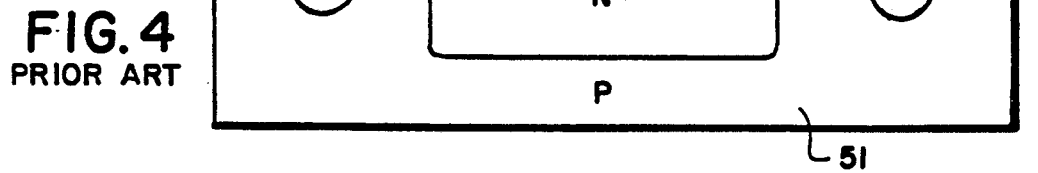
FIG. 4 is a vertical cross section of the device of FIG. 1 at a step of fabrication subsequent to FIG. 3.
Figure 5:
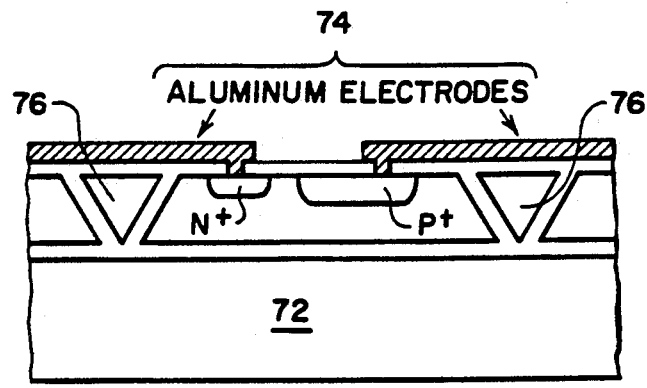
FIG. 5 is a vertical cross section of a device fabricated by an alternate prior art process.
Figure 6:
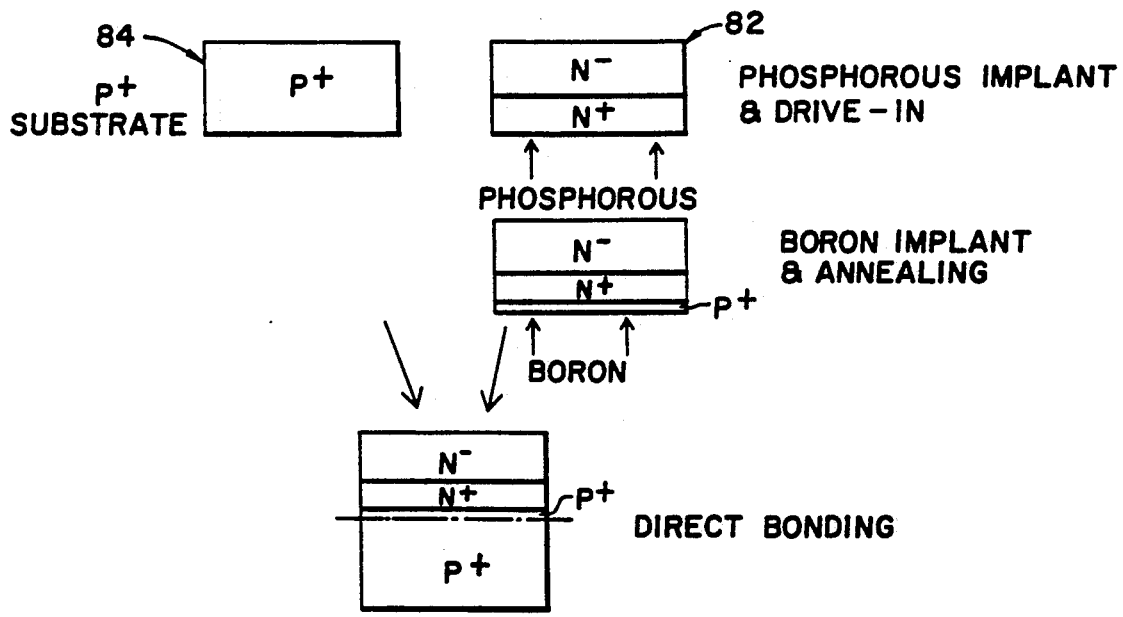
FIG. 6 is a drawing showing the sequence of direct wafer bonding according to a further alternate prior art process.
Figure 7A:
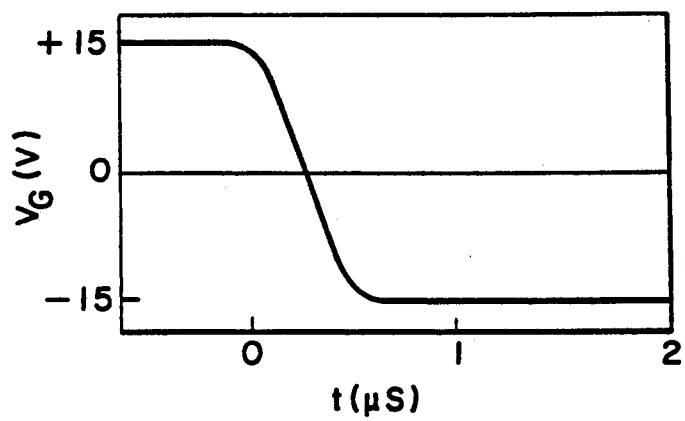
FIGS. 7A and 7B are graphs illustrating the characteristics of a device fabricated according to a further alternate prior art process.
Figure 7B:
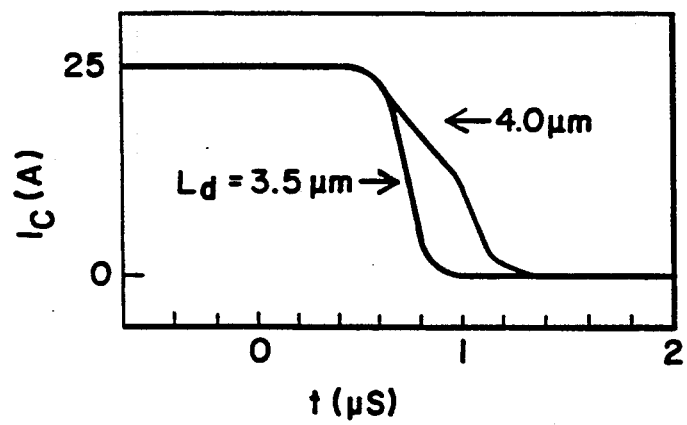
Figure 8:
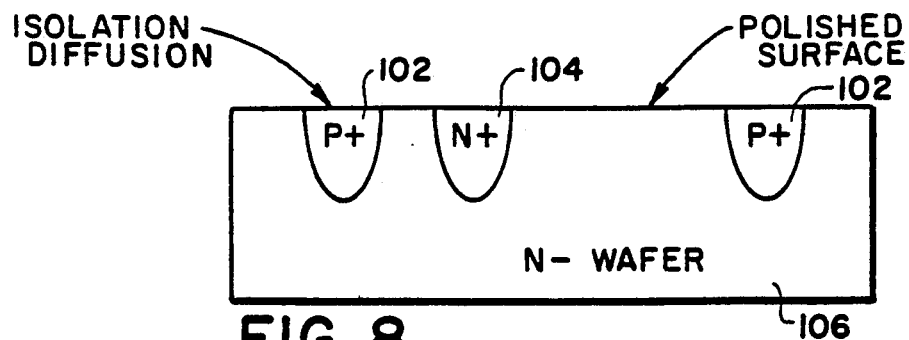
FIG. 8 is a vertical cross section of a wafer showing selectively diffused regions therein.
Figure 9:
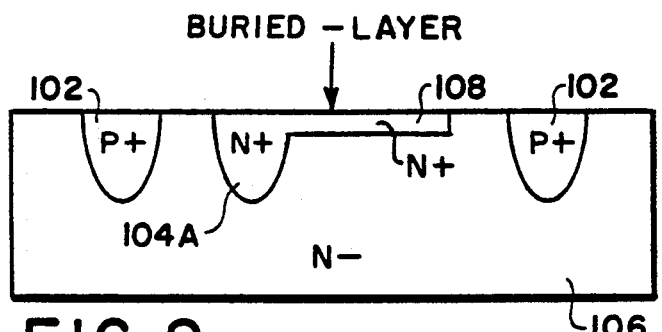
FIG. 9 is a vertical cross section of a wafer showing the addition of a buried layer to the wafer of FIG. 8.

The process starts with selecting a wafer of a resistivity chosen so that the final thin lightly doped layer corresponds to the conventional epitaxial layer resistivity. The isolation diffusion region 102 and the topside collector contact diffusion region 104 are done into this wafer 106 as shown in FIG. 8. In this case, the starting wafer is an N wafer 106 with P+ isolation diffusions 102 and an N+ collector contact diffusion 104. These diffusions can be made as deeply as desired without limitations due to the updiffusion of a buried layer, etc., and are not a compromise between device properties as is the case in conventional processing. After the diffusions, the buried layer 108 is added as shown in FIG. 9 by known techniques. In this technique, there is no process requirement to make it lightly doped or deeply diffused. For instance, the buried layer 108 resistance can easily be within the 2-10 ohms/square range while being as shallow as one micron deep. This is 2-10 times more heavily doped than the conventional process and potentially 10-20 times shallower.

Figure 10:
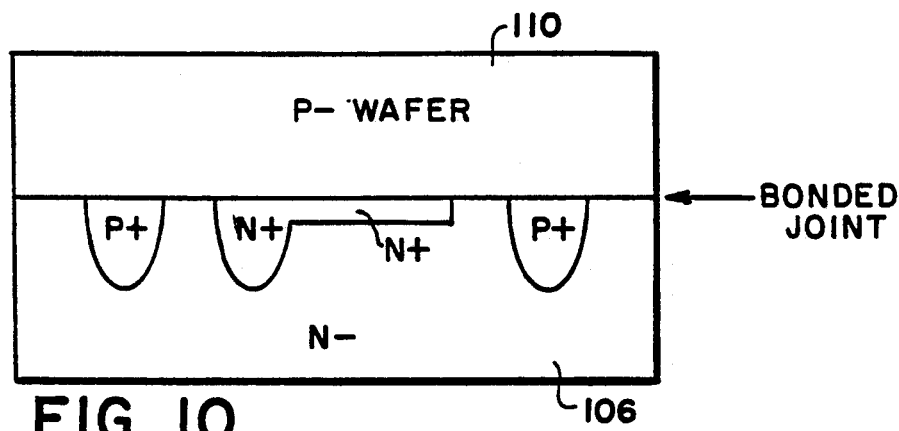
FIG. 10 is a vertical cross section of a semiconductor according to the present invention, showing the addition of a second wafer bonded to the first wafer.
Figure 11:
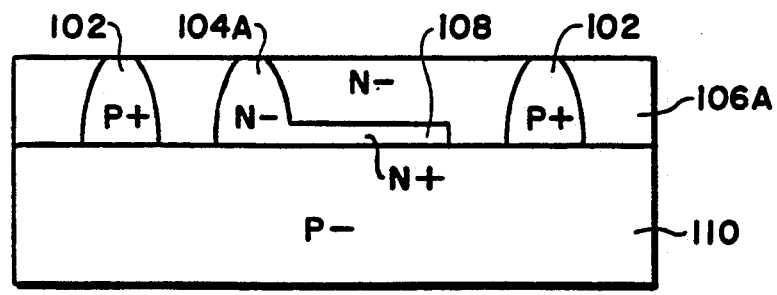
FIG. 11 is a vertical cross section of a semiconductor of FIG. 10, showing the subsequent step of thinning the first wafer.

After the buried layer process, the wafer 106 is bonded to a P wafer 110 as shown in FIG. 10 using the techniques discussed in references 1-3. Alternately, if the initial starting wafer 106 is a P wafer, then this second wafer 110 comprises an N wafer. While this bonding process causes some outdiffusion of the buried layer and of the isolation diffusion, it is significantly less than the conventional epitaxial process as it does not involve any gas phase transport. In addition, the bonding times and temperatures, such as 1050° C. for one hour, are typically significantly less than that required to drive the isolation diffusion, which normally must be done after the buried layer is formed. The outdiffusion can be reduced further by the use of slow diffusers for the buried layer such as arsenic After the wafer is bonded, the starting (N) wafer 106 is thinned, for instance by conventional lapping and polishing to the desired thickness for the device application as shown in FIG. 11. FIG. 11 has the thinned wafer 106A in the final, right side up position which is the inverted position of that shown in FIG. 10. The bonded wafers now comprise a JI wafer to be finished as a device by known techniques to provide a transistor or diode or other semiconductor structure.

The advantages of this process described above is that it allows the buried layer resistance to be optimized independent of the isolation and sinker diffusions and it allows junction isolation of devices with thick, lightly doped regions. The factor of 2-10 reduction in the resistance of the buried layer directly translates into a higher current-carrying capability by a factor depending on the device type. For a vertical MOS device, this translates almost one-to-one into higher current capability and for a bipolar where most of the current flows from the edge, it typically is at least a factor of two better for a real structure. The previous example for the 15 micron thick epitaxial layer would now leave a lightly doped layer of distance 112 between the top of the buried layer and the top of the wafer of about 9 microns resulting in a breakdown voltage of about 180 V or a three-fold improvement over the conventional structure. The big gain in breakdown voltage is provided by the thickness of the lightly doped layer minus the depth of the buried layer 108. The buried layer 108 depth is a constant, for instance 6 microns, and so the breakdown voltage is set exclusively by the first isolation diffusion 102 depth. Conventional isolation diffusions depths are limited typically to 30 microns, which would allow this technology to fabricate devices with breakdown voltages of as high as 500 volts.

Various techniques exist for finding and aligning to the patterns formed in the wafer as are known in the art or described in copending application Ser. No. 202,148 (UNI-047XX), entitled "New Diode Structure", filed June 24, 1988, incorporated by reference The known chemo-mechanical polishing techniques use a chemical which etches heavily doped silicon faster than lightly doped silicon and as a result slightly recess the isolation and sinker diffusion regions. These diffusions are also typically visible because of their heavy doping compared to the surrounding regions. Another technique would be to oxidize the wafer in a low, 900° C., temperature steam ambient which would selectively oxidize the N+ regions which could be used as an alignment mark. This technique would be free of a "pattern shift" as usually seen in epitaxial processes and thus would require no offset.

The following enhanced process steps and resulting alternate embodiment structures further extend the present invention beyond the process steps and device structures discussed above.

Figure 12:
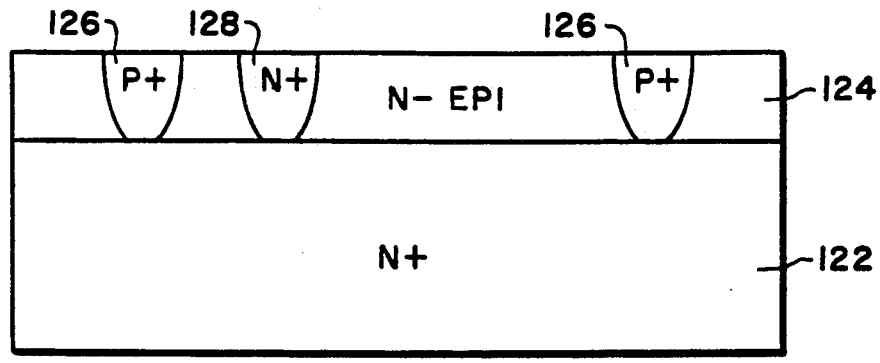
FIG. 12 is a vertical cross section showing a semiconductor manufactured according to an alternate process according to the present invention.

1. To improve the thickness control of the final lightly doped layer across the entire wafer the starting wafer 122 of FIG. 12 includes an epitaxial layer 124, replacing the N— wafer 106 of FIG. 8 The wafer 122 (which will later be removed) includes an epitaxial layer 124 on it which will form the active layer of the finished device In FIG. 12, a heavily doped N+ substrate 122 has an epi layer 124 grown on it of the same resistivity as the N wafer 106 of FIG. 8 and of the desired thickness. Next, the isolation diffusion regions 126 and sinker diffusion regions 128 are driven into the epitaxial layer 124. In this case, the N+ substrate 122 will outdiffuse into the epitaxial layer and thus will require a thicker as-grown epitaxial layer than it would if the substrate was lightly doped. This, however, can be almost eliminated by incorporating the technique of enhancement 4, discussed below. The removal of the substrate to reveal the backside of the epitaxial layer as the new top of the wafer provides the advantage of this technique. Several etching solutions, such as a mixture of 3:1:8 HF:Acetic Acid:HN03, will etch the N+ substrate 122 very fast and will etch the N epitaxial layer very slowly thus allowing the substrate to be selectively removed without introducing any thickness variations across the wafer as would be expected by a purely mechanical technique such as lapping and polishing. A preferred technique of this enhancement is to lap the substrate to within a mil or less of the epitaxial layer and then to chemically remove the rest. This would eliminate the need to protect the rest of the structure against the long chemical etch to remove the entire wafer while also eliminating any nonuniformity from the lapping process. Such chemical selectivity could also be achieved by using a P+ substrate. The epitaxial layer 124 in both cases could be N or P type.

Figure 13:
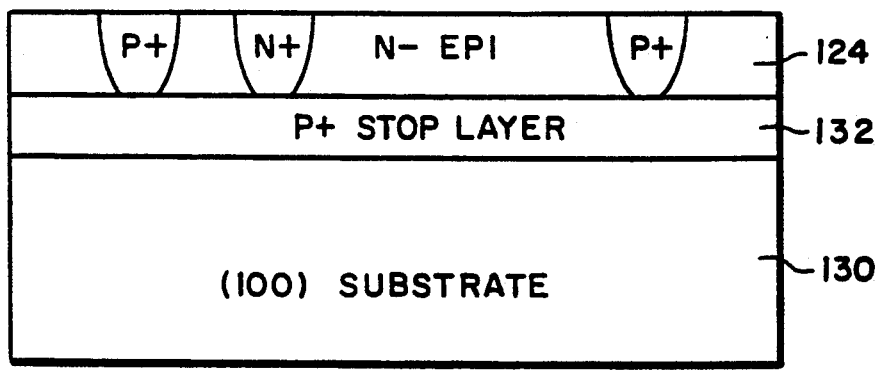
FIG. 13 is a vertical cross section of a semiconductor device fabricated according to an alternate process according to the present invention.

An alternative method of achieving a chemical stop is to use a (100) oriented wafer 130 and grow the desired epi layer 124 on top of a P+ diffusion layer 132 as shown in FIG. 13. In this case, the doping of the substrate 130 does not matter except that it cannot be P+. Several chemical solutions, such as KOH, which etch non-P+ doped (100) silicon but not P+ silicon, and could be used to selectively remove the substrate later in the process. The remaining P+ layer 132 which is the etch stop can be removed in the polishing operation or by using a selective etch as previously mentioned which would remove the P+ layer without attacking the lightly doped layer underneath. This technique may be combined with lapping as previously described.

Figure 14:
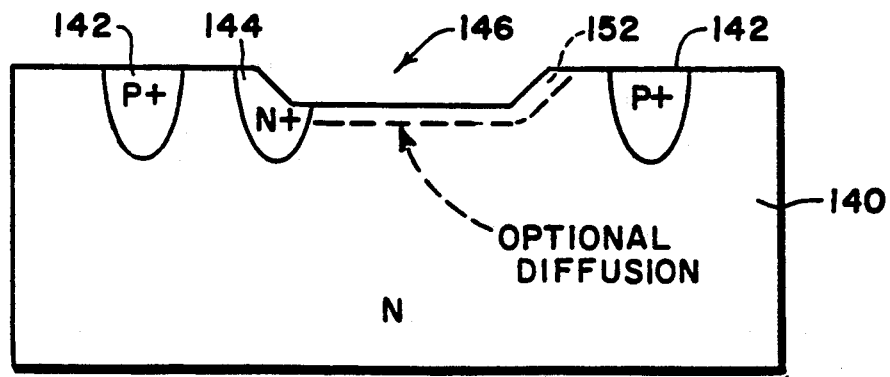
FIG. 14 is a vertical cross section of a semiconductor wafer showing an alternate process step according to the present invention.
Figure 15:
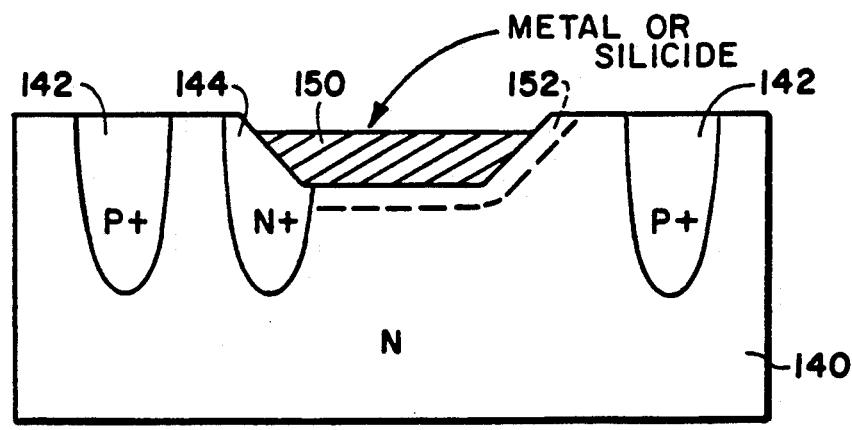
FIG. 15 is a vertical cross section of a semiconductor wafer showing the addition of a refractory metal or metal silicide to the device of FIG. 14.

2. To reduce the resistance of the buried layer even further than previously described, the diffusion could be replaced or shorted by a metal or a metal silicide as shown in FIGS. 15-18. The N wafer 140 first receives the isolation 142 and sinker 144 diffusion as shown in FIG. 8. Then, before a buried layer diffusion or after the buried layer diffusion, if desired, the buried layer region plus all or part of the surface of the sinker diffusion region are recessed 146 as shown in FIG. 14. As shown in FIG. 15, this recess 146 is then filled with a material 150 of high conductivity, which will maintain its conductivity throughout the various high temperature steps later in the process without also adversely reacting with the silicon regions. Typically, this would be a refractory metal or refractory metal silicide or both in a layered structure. This would include such materials as Ti, TiSi, W, WSi, Mo, MoSi, Ta, TaSi, as well as a number of other materials. It could also include a barrier layer between the silicon and the refractory material to improve ohmic contact as well as prevent reactions between the silicon wafer and the refractory metal or metal silicide. The barrier layer would be particularly useful in reducing the resistance of a refractory metal applied directly to the silicon which would tend to react to form the silicide, which in some cases is much more resistive than the pure metal. An example of such a barrier would be a layer of TiN covered with tungsten. Using conventional silicide-producing techniques developed by the IC industry to lower the resistance of the polysilicon gates would allow a buried layer resistance in the order of 0.1 to 1.0 ohms/square, which is an improvement of at least 100 over conventional processing and would allow topside contacted devices to approach vertical devices in total parasitic resistance. By further applying thick layers of, say, tungsten, even lower resistances can be achieved. For the purpose of this patent application, this metal or metal silicide layer is called the conducting layer.

Figure 17:
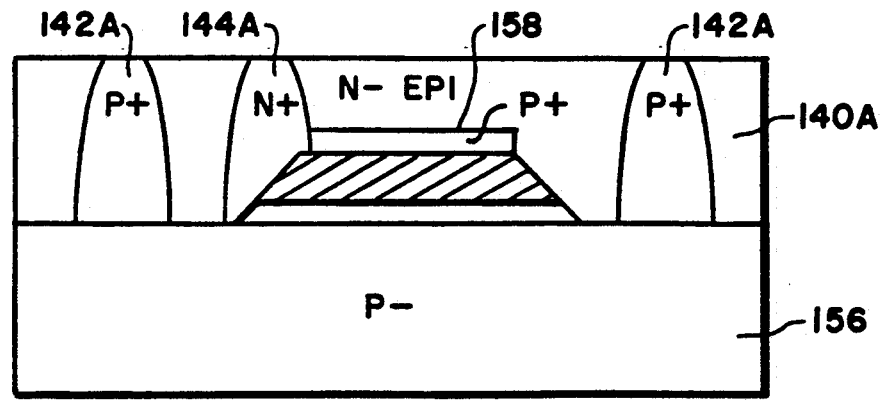
FIG. 17 is a vertical cross section of a semiconductor manufactured according to a further alternate process, showing the addition of a buried layer to a structure similar to the device of FIG. 16.
Figure 18:
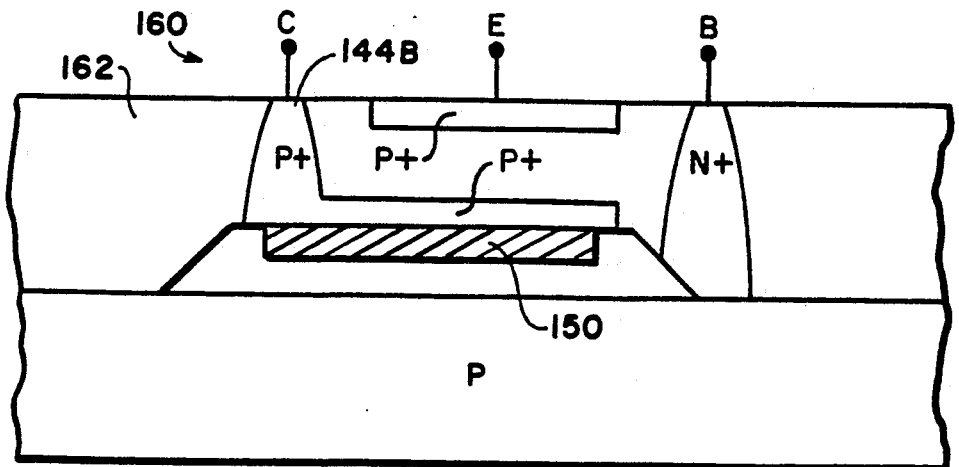
FIG. 18 is a vertical cross section of the device showing a further alternate process according to the present invention.

In addition to eliminating buried layer resistance, the technique of enhancement 2 permits the device implementation without the limitations of a heavily doped buried layer of opposite polarity to the substrate, since the buried layer resistance is now determined by the conducting layer. Thus, if it was an advantage to have a lightly doped buried layer, the technique of the second enhancement of the present invention allows it without compromising total buried layer resistivity. For instance, the need for a deep layer is eliminated as the buried layer only has to be deep enough to obtain a good ohmic contact. Also, the present invention as shown in FIG. 17 allows the fabrication of structures which are impossible to do in conventional technology. The buried layer is a P+ layer brought to the surface by an N+sinker diffusion region 144A and junction isolated from the P substrate 156. The P+ buried layer 158 is formed in such a way that sufficient spacing, e.g., 20 microns, are allowed at the edges, such that the breakdown voltage to the substrate is greater than the working voltage of the circuit. The P+ layer 158 is allowed because it is shorted to the N+ sinker 144A and does not introduce a diode drop. This structure is discussed in a related application (UNI-050XX) entitled INVERTED EPITAXIAL PROCESS SEMICONDUCTOR DEVICES, filed concurrently herewith, incorporated by reference, relating to the fabrication of an IGBT or an SCR (Silicon Controlled Rectifier) in planar, vertical form or other four-layer devices It also would allow the fabrication, with a P+ sinker (144B), of a vertical PNP transistor 160 as shown in FIG. 18 in a vertical NPN process. In this case the conducting layer 150 is an optional addition to the process.

Figure 16:
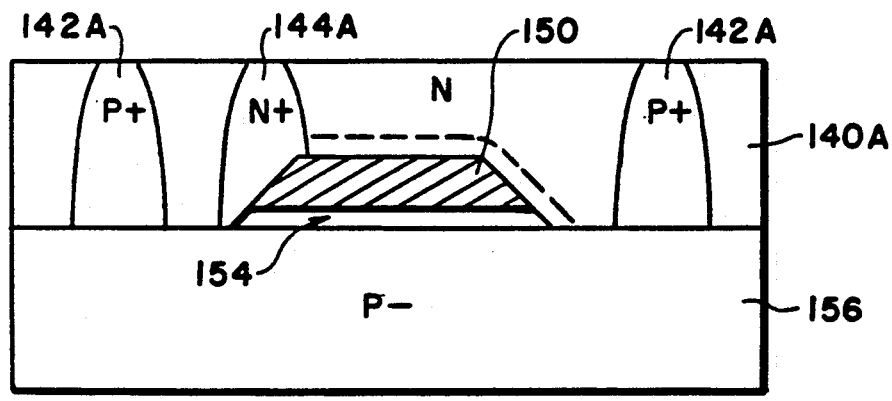
FIG. 16 is a vertical cross section of a semiconductor device, showing an additional wafer bonded to the wafer of FIGS. 13 and 14.
Figure 19:
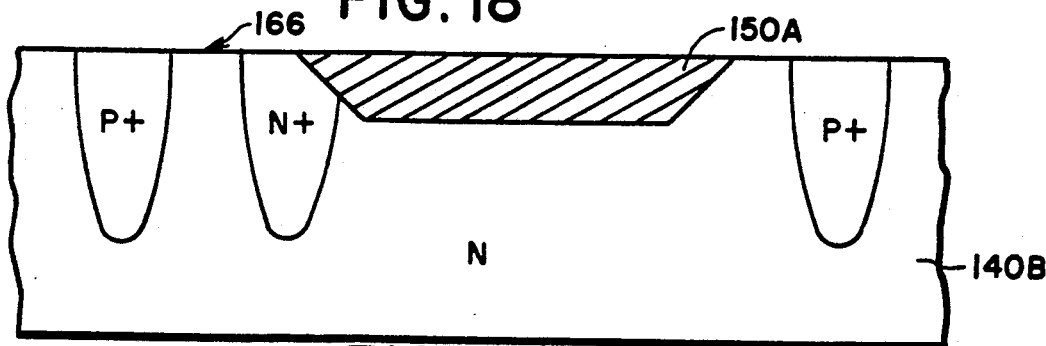
FIG. 19 is a cross section of a semiconductor wafer showing a step in the process of a further alternate process according to the present invention.

As shown in FIG. 16, the gap 154 between the bottom of the buried conducting layer 150 and the top of the substrate wafer 156 introduced by this process will to some extent limit the thermal performance. The limitation of thermal conduction will be offset since less heat will be generated with the conductive layer 150, thus eliminating the need for good thermal performance. One method of eliminating the gap is to place a pure refractory metal or a silicon-poor silicide in the recessed region such that during the bonding and later temperature cycles a complete silicide is formed and the resulting volume expansion will cause the silicide layer to fill the void thus eliminating the gap. A second technique would be to take the wafer 140 as shown in FIG. 15 and polish it such that the conducting layer 150A is flush with the surface 166 as shown in FIG. 19. When this polished wafer 140B is then bonded, it will be voidless, eliminating any parasitic thermal voids and providing a better thermal conductor than the pure silicon structure for most conducting layers.

Figure 19A:
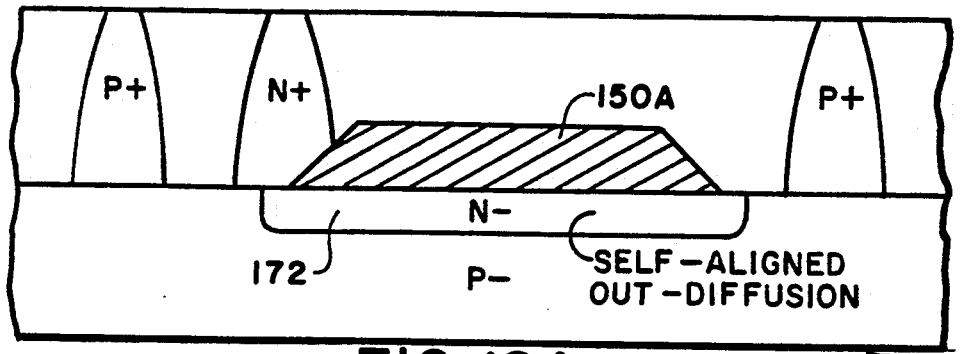
FIG. 19A is a cross section of a structure showing a subsequent step in the process illustrated in FIG. 16.

If the conducting layer is made with a voidless technique such that it touches the bottom substrate wafer as well as the top wafer, the bottom wafer under the conducting layer can be doped to reduce leakage current and improve breakdown voltage between the conducting layer and the substrate, as shown in FIG. 19A. The metal 150A or metal silicide could be doped (172), as deposited or after deposition, for example, by ion implantation. Then, during the bonding cycle, as well as any later additional thermal cycles, the dopant will outdiffuse into the substrate creating a self-aligned diffusion region 172 under the conducting layer and junction isolating it from the substrate.

If the buried layer is just the metallic layer, or a metallic layer combined with a lightly doped buried layer, then it is possible to provide deeper than normal top down isolation regions and sinker diffusions regions (not shown) than in a conventional process. This is because as the isolation and sinker diffusions are moving down, the buried layer will not be moving up at all with a pure metallic buried layer or only slowly with a lightly doped silicon, metallic buried layer. Thus, it may not even be necessary to do the isolation and sinker diffusions before bonding to achieve high breakdown voltage. According to the present invention, the wafers can be introduced into the conventional production line at the isolation diffusion step which is typically only the second mask. The conventional isolation diffusions would not have to be changed to achieve a much higher breakdown voltage because the isolation diffusions are through the epi layer, not to the top of the buried layer and thus create nonburied layer epi islands which are much thicker than buried layer epi islands. With this technique the buried layer and nonburied layer islands would be about the same thickness and result in transistors having a much higher breakdown voltage.

Figure 20:
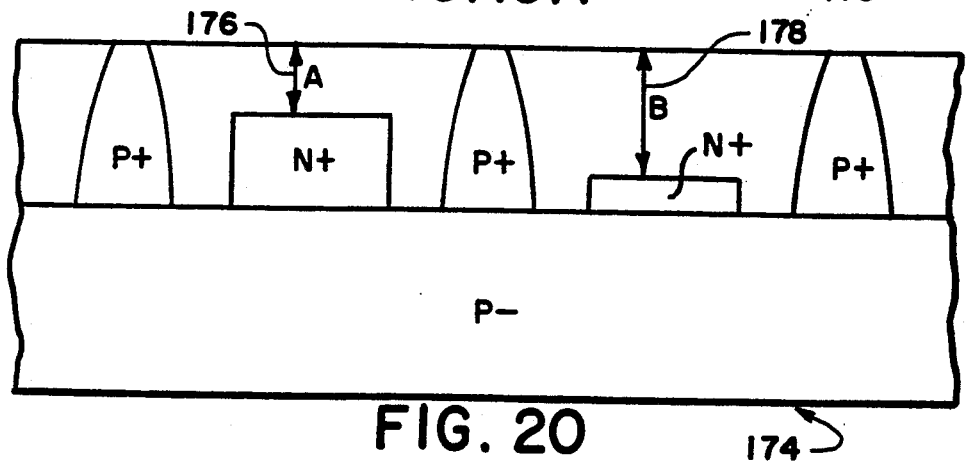
FIG. 20 is a vertical cross section of a structure manufactured according to a further alternate process according to the present invention.

3. To allow regions of various "epitaxial" thickness, the buried layer can be driven deeper in some areas than in others as shown in the structure 174 of FIG. 20. In many bipolar circuits, it is desirable to have a low voltage, high density logic section and a high voltage power section which normally means that a compromise has to be made between a thin epi for the logic and a thick epi for the high voltage section. One widely used form of dense bipolar logic is IIL (Integrated Injection Logic) and although its density does not degrade severely with epitaxial thickness, its speed performance does. The degradation of speed performance can be addressed by the techniques of the present invention by the use of two or more buried layers which are diffused in different distances before bonding. This results in two or more "epitaxial" layer thicknesses as indicated in FIG. 20 by a thin layer with a thickness 176 and a thick layer with a thickness 178. This allows the fabrication of high performance IIL together with high voltage transistors on the same chip. This technique is not limited to IIL and can be used with any structure/device where two or more lightly doped thicknesses region are desired.

Figure 21:
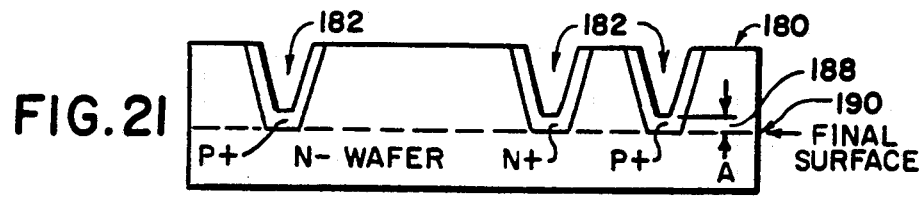
FIG. 21 is a cross section of a wafer showing a structure fabricated according to a further alternate process according to the present invention.
Figure 22:
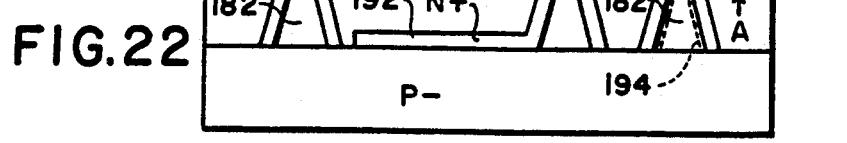
FIG. 22 is a vertical cross section of a semiconductor structure showing a subsequent process of the structure of FIG. 21.

4. To provide JI in very thick, lightly doped regions, the JI areas 182 are recessed into the starting wafer 180 before the isolation diffusion as shown in FIGS. 21 and 22. As pointed out in enhancement 1, this technique is also beneficial to prevent unwanted substrate outdiffusion when the substrate is an epitaxial layer on a heavily doped substrate. The isolation and sinker diffusion regions 184, 186 can be defined and recessed as shown in FIG. 21 to a depth which will leave enough silicon on the surface 190 in the finished device to be mechanically strong. A typical final thickness could be in the range of 5–20 microns and is shown as 188 on FIG. 22. Thus, for instance, if thickness 188 is chosen to be 10 microns and the desired lightly doped region was, say, 50 microns, then the isolation and the sinker diffusion regions 184, 186 would be recessed 40 microns deep. After the recess is formed, the diffusions are done to a depth such that the final process achieves a diffusion all the way to the surface. This could be most easily done by diffusing the P+ and the N+ 10 microns deep prior to bonding, but it could also be accomplished by a combination of up and down diffusions. The wafer is then bonded to the P substrate and lapped and polished so that the thickness 188 is the desired thickness, in this case 10 microns, as shown in FIG. 22. Using this technique, the isolation and sinker diffusion can be optimized for a single, for example, 10 micron diffusion and done exactly the same way for every process independent of the thickness of the lightly doped region. It also allows the junction isolation of epitaxial thicknesses that are impossible to do in conventional processes without losing planarity. For instance, it could be possible to junction isolate a lightly doped region that is 100 microns thick or thicker.

A second aspect of this process is that, when combined with enhancement 2, it allows the sinker to be shorted with a high conductivity layer like a refractory metal 194 further reducing the total resistance of the buried layer. Metallic shorting of the P+ isolation diffusion provides a low resistance ground line throughout the circuit which could save on wiring and improve density of the topside metallization. This low resistance ground path would be particularly interesting if the recessed wafer was bonded to an oxidized wafer instead of an unoxidized wafer to form a hybrid JI, DI process as described in enhancement 5, discussed below. In this situation, the isolation diffusions would be floating, they are normally connected to the substrate and extra metal lines would be required on the surface to tie them to ground potential. If the isolation diffusion were highly conducting, the connections to the isolation diffusions would be more widely spaced resulting in less of an area penalty.

A second benefit of the internal metallizations of the isolation diffusion would be that it would provide better isolation between regions. Diffused isolations regions, no matter how thick or heavily doped, always allow some minority carrier transport through them which can cause the circuit to malfunction. If the reason for the transport through these heavily doped regions is that when the minority carriers are generated, particularly in breakdown, a photon is first created which travels long distances, hundreds of microns in the lattice before capture by the lattice, where a minority carrier is released, then the photons are relatively unaffected by the heavily doped isolation regions and go right through it. A metalized core 194 isolation region, non-transparent to the photons, thus captures and recombines the photons before they have a chance to disturb the circuit. Thus, the core 194 provides true isolation where the substrate is shielded by the metallic buried layer and the side walls are shielded by the metal core isolation diffusion. This would again be useful for structures that use or generate minority carriers either in normal operation or structures which can go into breakdown.

Figure 23:
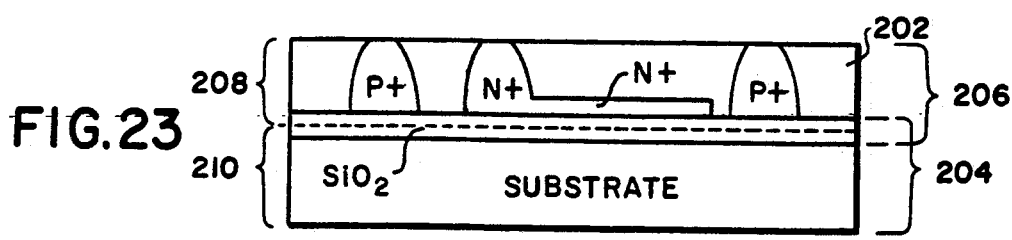
FIG. 23 is a vertical cross section of a structure fabricated according to a further alternate process according to the present invention.

5. To prevent unwanted substrate injection, the wafer 202 can be bonded to an oxidized wafer 204, as shown in the structure 200 in FIG. 23. This structure can be formed by bonding the diffused wafer 202 to an oxidized wafer 204 or the diffused wafer can be the oxidized wafer 206 or both wafers 208, 210 can be oxidized. In addition to oxide, other insulators such as silicon nitride can also be used. The advantage of this structure is that it can eliminate substrate connected parasitics, which are very important in power devices and four layer structures, such as exist in CMOS (Complementary Metal Oxide Semiconductor), while maintaining the simplicity of a junction isolated process. Large power devices, such as diodes, Schottky diodes, and bipolar transistors, tend to flood the substrate with minority carriers when they are on, necessitating a wide band around these devices where other devices cannot be placed lest they be affected by the substrate current. This technique would eliminate that problem and allow more of the silicon area to be used effectively. It does, however, require that the P+ isolation diffusions be grounded more frequently from the topside than would be required if they were all connected to the substrate. When this technique is combined with enhancement 4, it provides each device in a well which is dielectrically isolated except for approximately the top 10 microns of silicon.

Figure 24:
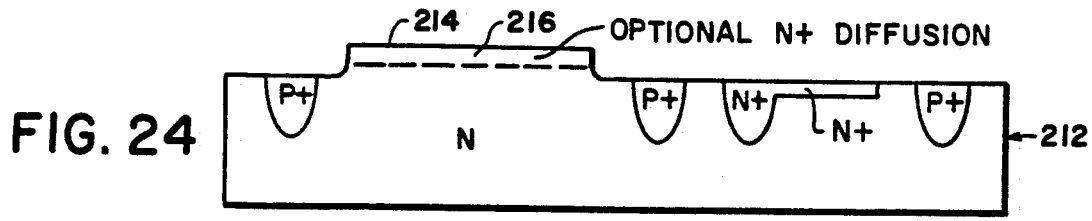
FIG. 24 is a vertical cross section of a semiconductor wafer showing a step according to a further alternate process according to the present invention.
Figure 25:
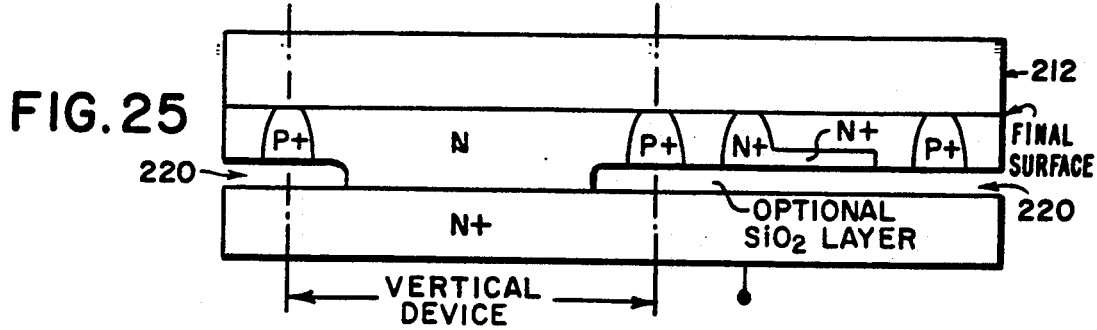
FIG. 25 is a vertical cross section of a semiconductor structure showing a subsequent step in the process illustrated by FIG. 24.

6. To allow vertical devices in the enhancement 5, the first wafer 212 can be processed to form a mesa 214 prior to diffusion and then after diffusion, bonded to a silicon wafer such that only the tops of the mesas bond as shown in FIGS. 24 and 25. First, an optional N+ diffusion 216 is made across the entire wafer and then the wafer is moated, leaving unmoated the areas (mesa 214) which will form the vertical device. Then the isolation and sinker diffusions are done as previously discussed, then the wafer 212 is bonded to a substrate wafer 218 which is typically heavily doped to reduce the resistance of the device. Only the tops of the mesas 214 bond, leaving a gap 220 the depth of the mesa in the other areas as shown in FIG. 25. If desired, the mesa depth can be made shallow enough that the gap between the wafers can be oxidized shut (not shown), leaving a solid wafer with selective buried oxide in it. Thus, the process according to the present invention allows the combination of a vertical power device with devices fabricated by the inverted epi process, retaining all of the advantages inherent therein.

Figure 26:
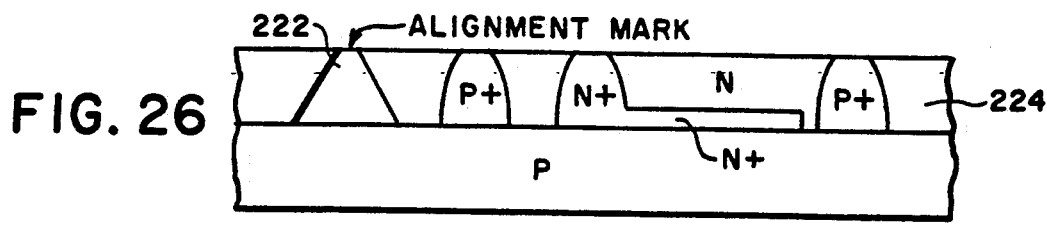
FIG. 26 is a vertical cross section of a structure fabricated according to an alternate process according to the present invention.

7. A recess 222 is made into the wafer before bonding which would be exposed after thinning of the substrate, as shown in FIG. 26, and used to align to the other structures in the N layer 224. In one inventive process, this alignment mark 222 is recessed before or after the diffusion, or alternately during the diffusion if the diffusions are being done into recesses. An anisotropic etch such as KOH would give very precise marks with which to align to. A doping selective etch could be used in an isolation or sinker diffusion to have the same effect as well as act as an endpoint during the polishing operation. It could also be formed mechanically, such as with a saw.

Figure 27:
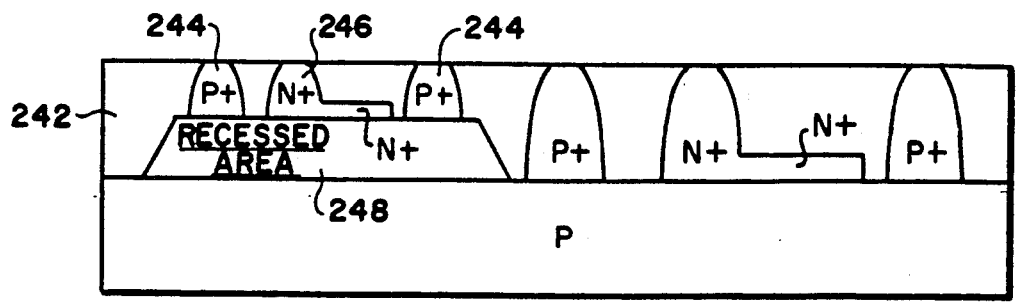
FIG. 27 is a vertical cross section of a structure manufactured according to a further alternate process according to the present invention.

8. Regions of various thickness lightly doped material can be achieved by the enhancement 8 where the thinner regions are recessed 248 before bonding, as shown in FIG. 27. This alternative enhancement to the present invention to provide buried layers of various depths has the advantage of better density for JI (Junction Isolated) devices over the deep buried layer in that the isolation diffusions are shallower and thus use less lateral space due to lateral diffusion. This technique is formed, as in enhancement 7, where the wafer 242 is recessed before bonding. One difference is that the optimum structure would require separate shallow isolation and sinker diffusion regions 244, 246, respectively, to achieve the optimum density However, this enhancement allows a high performance linear circuit to be fabricated on the same chip as a high voltage device.

Figure 28:
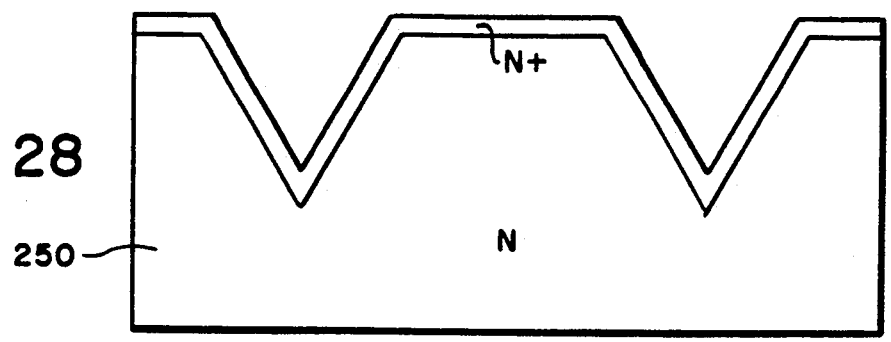
FIG. 28 is a vertical cross section of a semiconductor wafer showing a process step according to a further alternate process according to the present invention.
Figure 29:
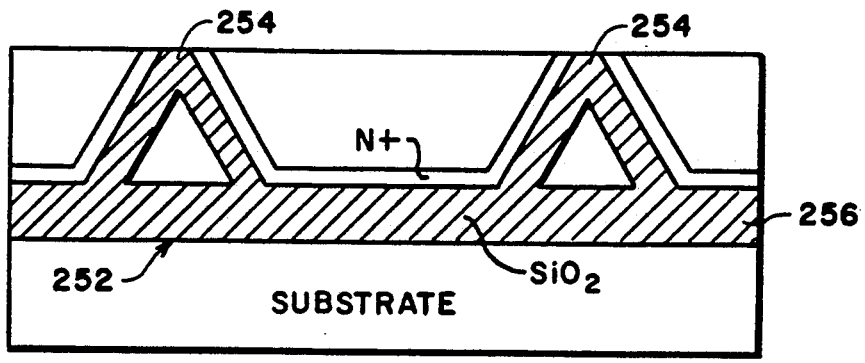
FIG. 29 is a vertical cross section of a semiconductor structure embodying a step subsequent to the step illustrated by FIG. 28.

9. A DI (dielectrically isolated) wafer can be made using the recess before bond technique as shown in FIGS. 28 and 29 without the use of polysilicon fillers or other materials to obtain a planar surface 252. The wafer 250 is recessed and doped exactly as is done in a conventional DI process except that it is now bonded down and lapped and polished until the tips 254 of the mesas are exposed as shown in FIG. 29, which is a conventional DI process upside down. The wafer can be oxidized (256) after moating and bonded to a silicon wafer or it can be bonded to an oxidized wafer or one or both of the wafers can be coated with an alternative material such as silicon nitride. For high voltage structures the moated wafer could be bonded to an oxidized wafer and then the side walls of the moats could be covered with an LPCVD (Low Pressure Chemical Vapor Deposition) SIPOS layer. In order to obtain a greater process latitude on the stopping of the polishing, the insides of the moats could be covered with a few microns of material such as polysilicon so that even if the recess was overpolished, material would still remain.

Figure 30A:
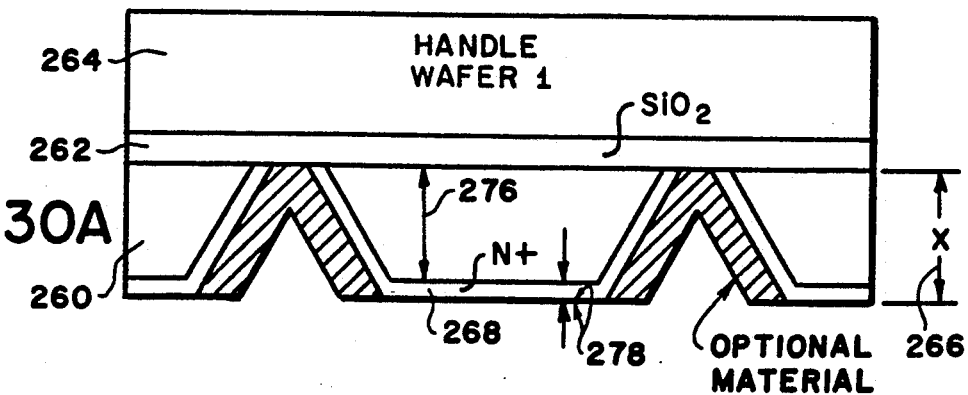
FIGS. 30A, 30B and 30C are vertical cross sections of various stages of fabrication of a structure manufactured according to a further alternate embodiment of the present invention.
Figure 30B:
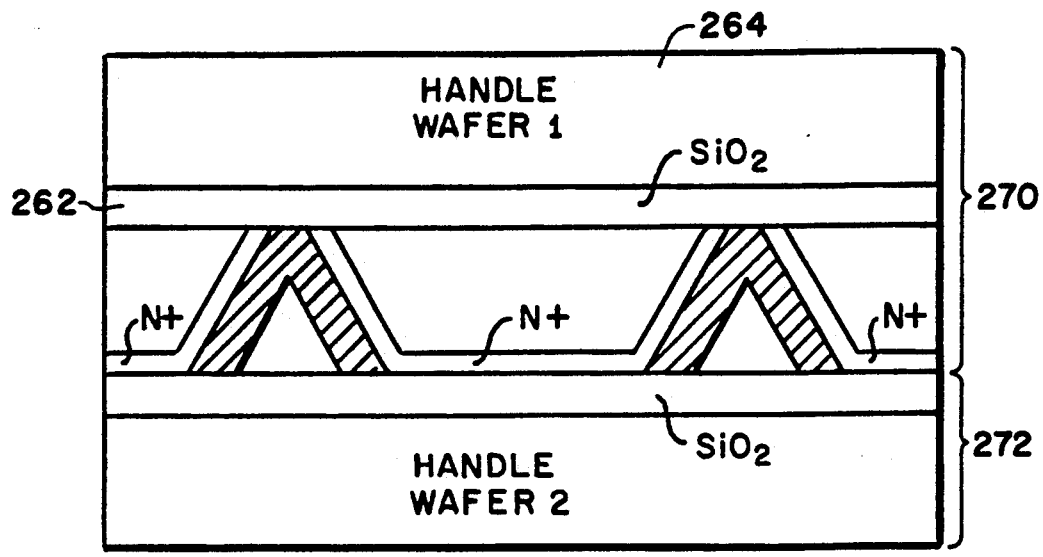
Figure 30C:
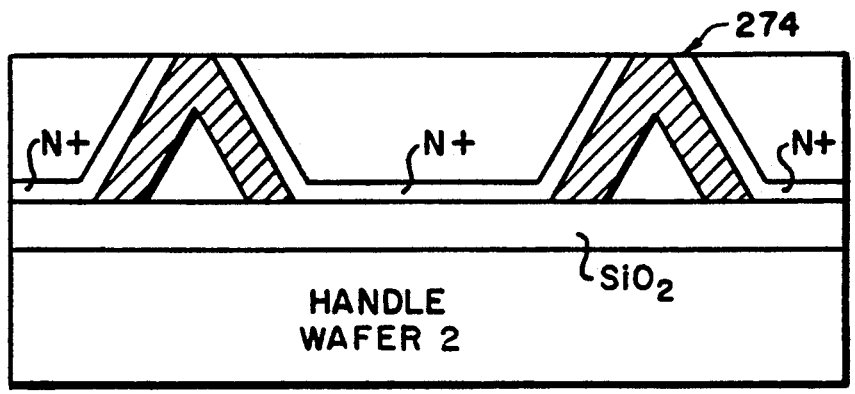

10. A further improvement on enhancement 9 which offers a greater flexibility and perfectly a flat polished surface by design is a process which involves bonding three wafers together as is shown in FIGS. 30A, B and C. First, an N or P substrate 260 of the correct resistivity for the lightly doped layer is oxidized 262 and bonded onto a handle wafer 264 which acts as a mechanical support for later processing. The substrate is then lapped and polished to thickness 266 as shown in FIG. 30A. The substrate 260 is then patterned using a process which is selective to the oxide layer 262. The substrate is then heavily doped to form the buried layer 268. The bonded wafers 270 can now be bonded onto an oxidized wafer 272, handle wafer 2, which will be the final mechanical support for the DI islands. In embodiments having channels throughout the wafer, the sidewalls can be oxidized during or after bonding. If desired, the sidewalls can be oxidized before bonding and the substrate can be bonded onto a silicon or oxidized silicon wafer. It is also possible to coat the sidewalls with other passivants (not shown) such as SIPOS or other CVD (Chemical Vapor Deposition) films and/or to deposit a layer of polysilicon as in the conventional DI situation, as shown by the shaded area in FIG. 30A. A deposited layer can provide a mechanical support when the etch leaves a wide separation at the interface to the oxide 262. If a deposited layer were used, then it must be removed from the top surface 278 before the bonding, such as by a lift-off deposition, photo patterning or by a final polishing step.

After this procedure, the first handle 264 is removed by a technique which is selective to oxide 262 such as lapping most of it off and then etching the rest in KOH. The planar original surface 274 is revealed and the oxide 262 can remain or be removed. This surface requires no polishing, etc., and is by definition planar.

One additional advantage of this technique is that it allows for compensation of the thickness of the film thickness 266. If the desired thickness of the lightly doped region is 276, then the thickness 266 can be measured after polishing and the N+ depth 268 can be adjusted so that thickness 276 is always the same independent of thickness 266. This technique can compensate for at least as much as one mil of error in polishing which is much more than is generally required on commercially available machines.

Figure 31:
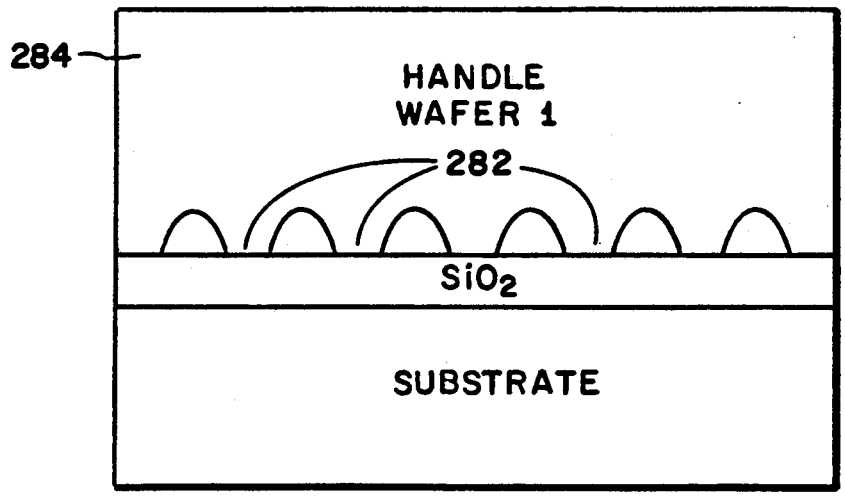
FIG. 31 is a vertical cross section of a structure manufactured according to a further alternate embodiment according to the process of the present invention.

The handle wafer 1, 264 can be made to be easily removed and made reusable if mesas 282 are formed therein before bonding as shown in FIG. 31. When it is time in the process to remove the handle wafer 1, 284 in the process, the wafer can be put into a solution of HF (Hydrofluoric acid) and it will remove the oxide between the handle wafer 1 and the substrate floating the handle wafer off The handle wafer 284 can then be reused to bond to another wafer. If the mesas 282 are made small enough, it is even possible to cleanly fracture the handle wafer off of the substrate.

Figure 32:
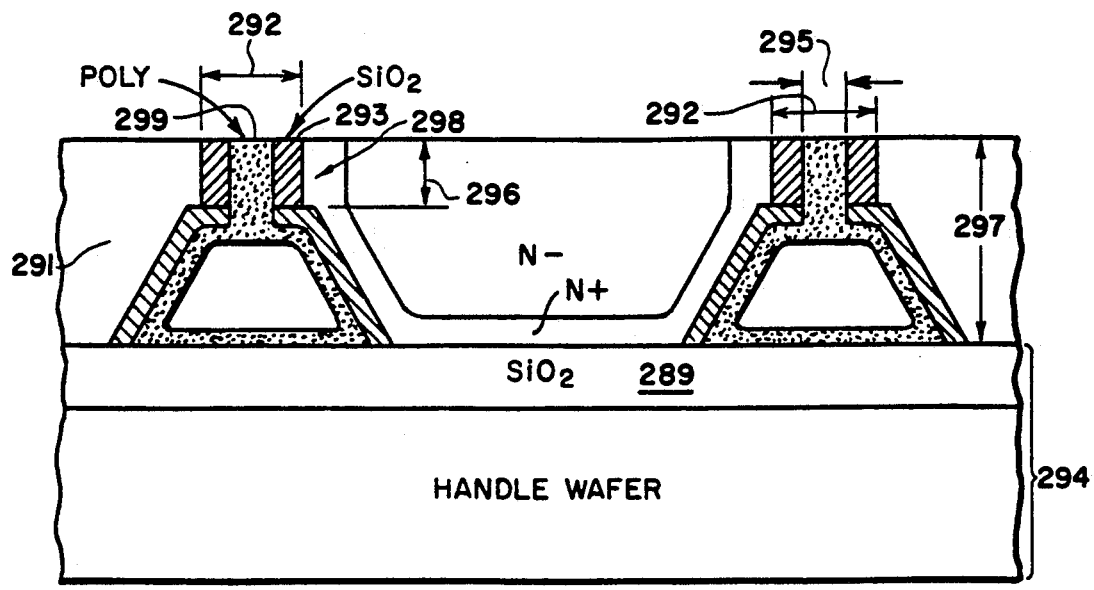
FIG. 32 is a vertical cross section of a structure manufactured according to a further alternate process according to the present invention.

11. The DI structure can also be achieved by combining the enhancements 4 and 5 wherein the isolation and sinker diffusions are recessed and then bonded to an oxidized silicon wafer 294. Subsequently, rather than use junction isolation of the top thin layer, trench 292 can be etched into it and backfilled to produce a structure as shown in FIG. 32. The starting wafer is recessed in the areas surrounding the desired islands to a depth which is the distance 296, for instance, 10 microns, on FIG. 32 less than the desired island thickness. Then the starting wafer is bonded to an oxidized wafer 294 and thinned to the correct thickness. At this point, a trench 292 is etched into the thin region 298 physically separating the islands. The edges of the island are then coated with an insulating, passivating layer 293 such as thermal oxide or LPCVD SIPOS, etc. The drawing of FIG. 32 shows the use of a thermal oxide. This reduces the width of the gap to the dimension 295. A film 299 is now deposited with a thickness which is at least one half dimension 295 so that it fills the trench and recreates a planar surface. The film layer 299 shown in FIG. 32 is an LPCVD polysilicon film because it has excellent coverage of the trench, excellent thermal match to the silicon wafer and a good thermal conductor. The material deposited on top of the nontrench areas (not shown) is removed in an isotropic etch resulting in the finished DI wafer ready for device fabrication.

The recess of wafer 291 before bonding is only useful if the thickness of the desired island is greater than dimension 296. If the thickness of the island is dimension 296 or less, then no recessing is necessary and the trench can be cut right down to the silicon dioxide layer 289. In practice, this would typically be applied to layers in the order of 10 microns or less, as the conventional RIE (Reactive Ion Etching) is relatively slow and it becomes more difficult to maintain the profile and etch rate as the trenches become deeper. Thus with the recess before bond, an RIE etch process can be developed for a particular etch depth and be used as a standard independent of the thickness of the island 297.

Figure 33:
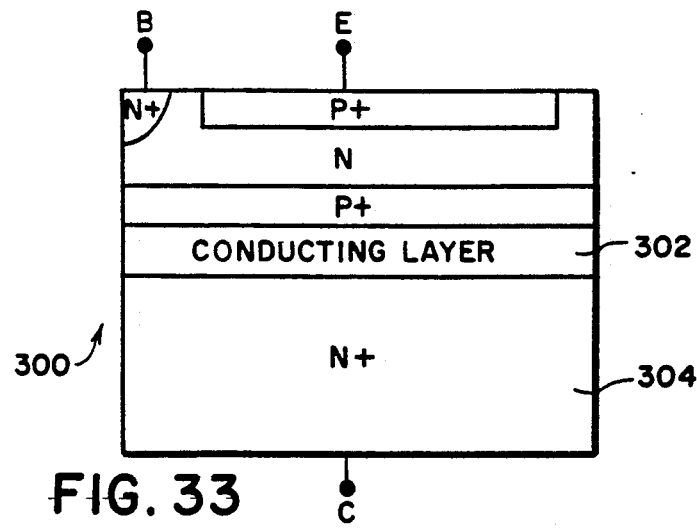
FIG. 33 is a vertical cross section of a semiconductor device manufactured according to a further alternative process according to the present invention.

12. Enhancement 2 discusses the use of a buried conducting layer to laterally short a P+ layer to an N+ layer inside the device. The buried conducting layer can also be used to short a P/N junction vertically in a device 300 as shown in FIG. 33. Here, the conducting layer 302 is used to make a vertical PNP transistor on an N+ substrate 304. This structure would provide a major advantage for a power transistor fabrication such as in a power PNP transistor, as the higher resistivity P+ substrate is a major component to the resistance of the device. Putting the PNP transistor on an N+ wafer would reduce the total resistance significantly, thus enhancing the performance of the PNP transistor. In applications such as this, it may be required to use a barrier layer (not shown) on one side of the conducting layer so that the dopant from one side does not diffuse through the conducting layer and dope the other side, thus eliminating the ability of the conducting layer to short the two regions.

Figure 34:
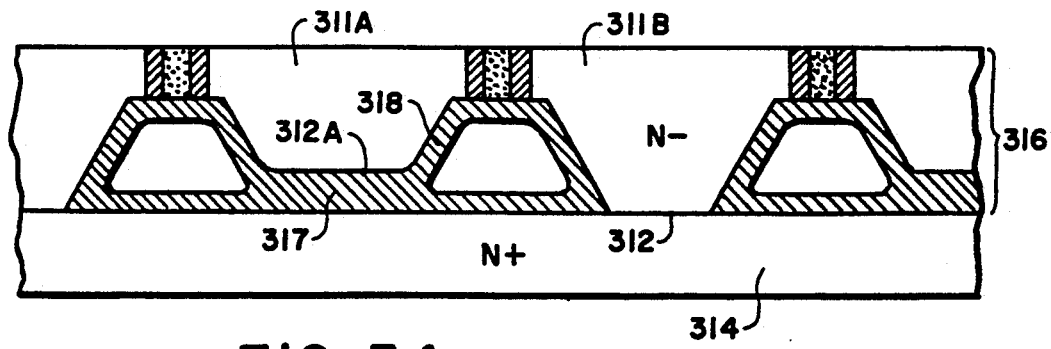
FIG. 34 is a vertical cross section of a structure manufactured according to a further embodiment of the present invention.

13. The DI approach can also allow islands with substrate contact so that vertical devices can be made side by side with planar devices 311A, B, as shown in FIG. 34. The island areas that are to be fullY isolated are recessed before bonding by a small amount, for instance, one micron. Then, after bonding to a bare silicon wafer 314, the bonded wafer 316 is oxidized (318) such that the gap 317 between the bottom of the unbonded island 312A and the bottom wafer 314 is filled with silicon dioxide 318. The bonded wafers 310 are then further processed as previously described.

Modifications and substitutions of the materials, structures and/or steps by one of ordinary skill in the art is considered to be within the scope of the present invention, which is not to be limited except by the following claims.

What is claimed is:

1. A method of semiconductor fabrication, comprising the steps of:
   diffusing one of a P+ and an N+ first doping substance in a first wafer to provide a first diffusion region;
   depositing a conductive material on one surface of said first wafer to provide a conductive region electrically connected to said first diffusion region; and
   bonding said first wafer to a second wafer having said conductive regions therebetween.

2. The method of claim 1, further including the step of forming a second diffusion region in said first wafer whereon said conductive material is deposited, said second diffusion region being electrically connected to said first diffusion region.

3. The method of claim 1, further including the step of
   forming a recess in said first wafer, wherein said conductive material is deposited in said recess.

4. The method of claim 1, further including the step of
   forming a second diffusion region on said first wafer;
   forming a third diffusion region on said first wafer disposed adjacent to said first diffusion region; and
   wherein said step of
   depositing a conductive material on said first wafer electrically connects said second and third diffusion regions.

5. The method of claim 1, wherein the step of
   depositing a conductive material comprises the step of depositing one of Ti, TiSi, W, Wsi, Mo, MoSi, Ta, and TaSi.

6. A method of semiconductor fabrication, comprising the steps of:
   growing an epitaxial layer on a substrate to form a first wafer;
   diffusing a first doping substance in the epitaxial layer to provide a first diffusion region;
   diffusing a second doping substance in the epitaxial layer to provide a second diffusion region;
   diffusing a third doping substance in the epitaxial layer to provide a third diffusion region, said third doping substance being of the same plurality as said second doping substance, and said second diffusion region being in electrical contact with said third diffusion region;
   bonding the surface of said first wafer having the epitaxial layer and the diffusions to a second wafer; and
   removing at least a portion the substrate of said first wafer, revealing said first and second diffusion regions.

7. The method of claim 6 further including the steps of bonding a third wafer to one of said first and second wafers.

8. The method of claim 6, further including the step of
   diffusing said third doping substance to form a fourth diffusion region on the same surface of said first wafer having said third diffusion region, and having a depth different from said third diffusion region.

9. The method of claim 6, further including the step of
   oxidizing the surface of at least one of said first and said second wafers prior to the step of wafer bonding.

10. The method of claim 6, further including the step of depositing a conductive material on one of said first and second wafers, wherein
    said conductive material electrically shunts said second and third diffusion regions; and
    bonding said first wafer to said second wafer having said conductive material therebetwen.

11. The method of claim 6, further including the step of
   patterning said first wafer to provide an aperture through said first wafer.

12. The method of claim 11, further including the step of
   depositing a nonconductive material into said aperture.

13. The method of claim 11, further including the step of
   positioning said first wafer surface relative to a surface of said second wafer according to the alignment of said aperture with selected features of said second wafer surface.

14. The method of claim 6, further including the step of
   outdiffusing said third doping substance from said third diffusion region into said second wafer.

15. The method of claim 6, further including the step of
   oxidizing the surface of at least one of said first and said second wafer prior to the step of wafer bonding.

16. The method of claim 6, further including the step of
   diffusing said third doping substance to form a fourth diffusion region on the same surface of said first wafer having said third diffusion region, and having a depth different from said third diffusion region.

17. A method of semiconductor fabrication, comprising the steps of:
   diffusing a first doping substance on a surface of a first wafer to provide a first diffusion region;
   diffusing a second doping substance on the surface of said first wafer to provide a second diffusion region;
   diffusing a third doping substance on the surface of the first wafer to provide a third diffusion region;
   said third doping substance being of the same plurality as said second doping substance, and said second diffusion region being in electrical contact with said third diffusion region;
   forming at least one mesa on the surface of the first wafer; and
   bonding the surface of the first wafer having said at least one mesa and the diffusion regions to a second wafer.

18. The method of claim 17 further including the step of removing a layered portion of said first wafer, revealing said first and second diffusion regions.

19. The method of claim 17 further including the step of bonding a third wafer to one of said first and second wafers.

20. The method of claim 17, further including the step of
   diffusing said third doping substance to form a fourth diffusion region on the same surface of said first wafer having said third diffusion region, and having a depth different from said third diffusion region.

21. The method of claim 17, further including the step of
   oxidizing the surface of at least one of said first and said second wafers prior to the step of wafer bonding.

22. The method of claim 17, further including the step of
   patterning said first wafer to provide an aperture through said first wafer.

23. The method of claim 22 further including the step of depositing a nonconductive material into said aperture.

24. The method of claim 22, further including the step of
   positioning said first wafer surface relative to a surface of said second wafer according to the alignment of said aperture with selected features of said second wafer surface.

25. The method of claim 17, further including the step of depositing a conductive material on one of said first and second wafers, wherein
   said conductive material electrically shunts said second and third diffusion regions; and
   bonding said first wafer to said second wafer having said conductive material therebetween.

26. The method of claim 17, further including the steps of
   forming at least one additional mesa having a height different from other mesas, and
   bonding said first and second wafers at selected mesas 27. The method of claim 26, further including the step of
   filling the distance between unbonded mesas with a material.

28. A method of semiconductor fabrication, comprising the steps of:
   diffusing a first doping substance on a surface of a first wafer to provide a first diffusion region;
   diffusing a second doping substance on the surface of said first wafer to provide a second diffusion region;
   diffusing a third doping substance on the surface of the first wafer to provide a third diffusion region;
   forming at least one recess in the surface of said first wafer, said recess comprising a junction isolated region;
   diffusing a doping substance in said junction isolated region;
   bonding the surface of said first wafer having the diffusions and the at least one recess to a second wafer; and
   removing a layered portion of said first wafer revealing said first and second diffusion regions.

29. The method of claim 28 further including the step of bonding a third wafer to one of said first and second wafers.

30. The method of claim 28, further including the step of diffusing said third doping substance to form a fourth diffusion region on the same surface of said first wafer having said third diffusion region, and having a depth different from said third diffusion region.

31. The method of claim 28, further including the step of oxidizing the surface of at least one of said first and said second wafers prior to the step of wafer bonding.

32. The method of claim 28, further including the step of patterning said first wafer to provide an aperture through said first wafer.

33. The method of claim 32, further including the step of depositing a nonconductive material into said aperture.

34. The method of claim 32, further including the step of
   positioning said first wafer surface relative to a surface of said second wafer according to the alignment of said aperture with selected features of said second wafer surface.

35. The method of claim 28, further including the step of
depositing a high conductivity material in said junction isolated region prior to the step of bonding.

36. The method of claim 28, further including the step of
removing a layered portion of said first wafer by etching after bonding to said second wafer to reveal said junction isolated region having a doping substance diffused therein.

37. A method of semiconductor fabrication, comprising the steps of:
diffusing a first doping substance on a surface of a first wafer to provide a first diffusion region;
diffusing a second doping substance on the surface of said first wafer to provide a second diffusion region;
diffusing a third doping substance on the surface of the first wafer to provide a third diffusion region;
forming at least one recess in the surface of said first wafer;
depositing a conductive material in said recess in the surface of said first wafer; and
bonding the surface of said first wafer having the diffusions and the at least one recess to a second wafer.

38. The method of claim 37 wherein said conductive material is electrically connected to said first diffusion region.

39. The method of claim 37 further including the step of bonding a third wafer to one of said first and second wafers.

40. The method of claim 37, further including the step of
diffusing said third doping substance to form a fourth diffusion region on the same surface of said first wafer having said third diffusion region, and having a depth different from said third diffusion region.

41. The method of claim 37, further including the step of
oxidizing the surface of at least one of said first and said second wafers prior to the step of wafer bonding.

42. The method of claim 37, further including the step of
removing a layered portion of said first wafer revealing said first and second diffusion regions.

43. The method of claim 37, further including the step of depositing a conductive material on one of said first and second wafers, wherein
said conductive material electrically shunts said second and third diffusion regions; and
bonding said first wafer to said second wafer having said conductive material therebetween.

44. The method of claim 37, further including the step of
patterning said first wafer to provide an aperture through said first wafer.

45. The method of claim 44, further including the step of
depositing a nonconductive material into said aperture.

46. The method of claim 44, further including the step of
positioning said first wafer surface relative to a surface of said second wafer according to the alignment of said aperture with selected features of said second wafer surface.

47. The method of claim 37, wherein said step of
depositing a conductive material comprises the step of depositing a refractory metal.

48. The method of claim 47, wherein the step of
depositing a refractory metal comprises the step of depositing one of Ti, TiSi, W, WSi, Mo, MoSi, Ta and TaSi.

49. The method of claim 48, wherein the step of
depositing a refractory metal includes the step of depositing a silicon diffusion barrier.

50. The method of claim 49, wherein the step of
depositing a silicon diffusion barrier comprises the step of depositing one of TiN, TiW, Ni, and WN.

51. The method of claim 37, further including the step of depositing a conductive material on one of said first and second wafers, wherein
said conductive material electrically shunts said second and third diffusion regions.

52. The method of claim 51, further including the step of
polishing the surface on which said conductive material is deposited, forming a substantially planar surface.

53. The method of claim 37, wherein the step of
depositing said high conductivity material electrically shunts said second and third diffusion region.

54. A method of semiconductor fabrication, comprising the steps of:
forming at least one recess in the surface of a first wafer wherein said recess provides a shallow recess region of substantially uniform thickness in said first wafer;
diffusing a first doping substance in the shallow recess region of said first wafer to provide a first diffusion region;
diffusing a second doping substance in the shallow recess region of said first wafer to provide a second diffusion region;
diffusing a third doping substance in the shallow recess region of the first wafer to provide a third diffusion region; and
bonding the surface of said first wafer having the shallow recess region and the diffusion regions to a second wafer.

55. The method of claim 54 further including the step of bonding a third wafer to one of said first and second wafers.

56. The method of claim 54, further including the step of
diffusing said third doping substance to form a fourth diffusion region on the same surface of said first wafer having said third diffusion region, and having a depth different from said third diffusion region.

57. The method of claim 54, further including the step of
oxidizing the surface of at least one of said first and said second wafers prior to the step of wafer bonding.

58. The method of claim 54, further including the step of depositing a conductive material on one of said first and second wafers, wherein
said conductive material electrically shunts said second and third diffusion regions; and bonding said first wafer to said second wafer having said conductive material therebetween.

59. The method of claim 54, further including the step of
patterning said first wafer to provide an aperture through said first wafer.

60. The method of claim 59, further including the step of
depositing a nonconductive material into said aperture.

61. The method of claim 59, further including the step of
positioning said first wafer surface relative to a surface of said second wafer according to the alignment of said aperture with selected features of said second wafer surface.

62. A method of semiconductor fabrication, comprising the steps of:
forming at least one recess in the surface of a first wafer wherein said recess provides a shallow recess region of substantially uniform thickness in said first wafer;
diffusing a first doping substance in the shallow recess region of said first wafer to provide a first diffusion region;
diffusing a second doping substance in the shallow recess region of said first wafer to provide a second diffusion region;
diffusing a third doping substance in the shallow recess region of the first wafer to provide a third diffusion region;
patterning said first wafer to provide an aperture through said first wafer;
positioning said first wafer surface relative to a surface of said second wafer according to the alignment of said aperture with selected features of said second wafer surface; and
bonding the surface of said first wafer having the diffusion regions to said positioned second wafer surface.

63. The method of claim 62, further including the step of
diffusing said third doping substance to form a fourth diffusion region on the same surface of said first wafer having said third diffusion region, and having a depth different from said third diffusion region.

64. The method of claim 62, further including the step of
oxidizing the surface of at least one of said first and said second wafers prior to the step of wafer bonding.

65. The method of claim 62, further including the step of depositing a conductive material on one of said first and second wafers, wherein
said conductive material electrically shunts said second and third diffusion regions; and
bonding said first wafer to said second wafer having said conductive material therebetween.

66. The method of claim 62, further including the step of
depositing a nonconductive material into said aperture.

67. The method of claim 62, further including the step of
bonding a third wafer to one of said first and said second wafer.

68. The method of claim 62, further including the step of
doping said aperture with one of a P+ and N+ doping substance to form a junction isolated region.

69. The method of claim 62, further including the step of
doping said aperture with one of a P+ and N+ doping substance to form a low resistance vertical contact.

* * * * *